United States Patent [19]
Alber et al.

[11] Patent Number: 5,744,962
[45] Date of Patent: Apr. 28, 1998

[54] AUTOMATED DATA STORING BATTERY TESTER AND MULTIMETER

[76] Inventors: Glenn Alber; Edward W. Deveau, both of 990 S. Rogers Cir. Suite 11, Boca Raton, Fla. 33487

[21] Appl. No.: 404,031

[22] Filed: Mar. 14, 1995

[51] Int. Cl.[6] .................................................. G01R 27/26
[52] U.S. Cl. ........................ 324/426; 324/430; 324/433
[58] Field of Search .................................. 324/427, 433, 324/429, 430; 340/636, 48

[56] References Cited

U.S. PATENT DOCUMENTS

| | | | |
|---|---|---|---|
| 4,352,067 | 9/1982 | Ottone | 324/434 |
| 4,423,379 | 12/1983 | Jacobs et al. | 340/636 |
| 4,697,134 | 9/1987 | Burkum et al. | 320/48 |
| 4,707,795 | 11/1987 | Alber et al. | 364/550 |
| 4,799,039 | 1/1989 | Balcom et al. | 340/333 |
| 4,816,768 | 3/1989 | Champlin | 324/431 |
| 4,876,513 | 10/1989 | Brilmyer et al. | 324/427 |
| 5,250,904 | 10/1993 | Salander et al. | 324/433 |
| 5,281,919 | 1/1994 | Palanisamy | 324/430 |
| 5,321,627 | 6/1994 | Reher | 324/431 |
| 5,345,163 | 9/1994 | Gibbons et al. | 324/430 |

*Primary Examiner*—Maura K. Regan
*Attorney, Agent, or Firm*—Malin, Haley, DiMaggio & Crosby, PA

[57] ABSTRACT

An intelligent automated battery multimeter system having data storing and multi-cell reading capabilities in a self-contained unit for automatically performing in-service DC load testing on battery cells without requiring the removal of battery chargers wherein the tester measures, records and displays load voltages, float voltages, internal cell resistance, intercell connection resistance and other cell integrity measurements. The battery tester is also computer compatible wherein it provides PC links for extracting data from the system and downloading it into computer networks.

15 Claims, 12 Drawing Sheets

AUTOMATED DATA STORING BATTERY TESTER AND MULTIMETER

BACKGROUND OF THE INVENTION

1. Field of the Invention

The present invention relates generally to battery test equipment for monitoring self integrity, and more particularly, to an intelligent automated battery multimeter system having data storing and multi-cell reading capabilities in a self-contained unit for measuring, recording and displaying self float voltages, internal cell resistance, inter-cell connection resistance and other cell integrity measurements. The present invention also provides a computer interface to download data to a computer for extracting data from the system and downloading it into computer networks.

2. Description of the Background Art

The internal resistance of battery cells dictates and indicates the capacity of a battery to supply power to a known load or circuit. The internal resistance of each cell in a battery source should be monitored and measured periodically to insure that a battery is maintaining full capacity. Taking measurements of this cell resistance is especially important for utility companies, phone companies, hospitals, stock exchanges, credit card companies, businesses having 24 hour on-line computer services and any company that relies on battery backup power as a source of uninterrupted power supply. Based on field testing of various types of batteries, such as lead, lead acid and lead calcium batteries, once a battery cell's internal resistance increases to more than 25% above its nominal value, the cell and battery are unable to meet their capacity requirements and fail capacity tests. The electrical resistance of storage battery cells is also an important measurement in telephone systems that use a central station battery. Cell resistance can help in ascertaining potential cross talk in telephone equipment and evaluating the amount of filtering required to remove hum, voice, and switching pulses from the output of battery charging equipment.

A simplified circuit model a load cell battery is shown in FIG. 1, which comprises natural capacitance $X_C$, electromechanical resistance $R_E$, and metallic resistance $R_M$. The electromechanical resistance is the cell's internal resistance and equals the sum of the resistance due to cell paste used on the cell's metallic grids, electrolytes in the cell and separators. The natural metallic resistance comprises resistance due to the battery terminal posts, strap, grids and grid to paste. As the electromechanical resistance is much lower than the metallic resistance, it is difficult to isolate and measure the electromechanical resistance for predicting battery cell capacity failure. Moreover, cell resistance measurements are frequency dependent when using conventional equipment because of the capacitance $X_C$ present across the electromechanical resistance $R_E$.

Conventional techniques and equipment for predicting battery failure and measuring battery capacity require the removal of the battery from service or from its battery charger. The battery is removed from service to avoid noise problems, allow the placement of a purely resistive load across the battery, and eliminate the presence of reactance in measurements. Probably the most common test used today for locating failing battery cells is the impedance test. The impedance test employs an AC current injection method wherein a known alternating current is injected into the unknown impedance and the resulting voltage observed. This presents several problems. For instance, the impedance test, as the name suggests, provides impedance measurement rather than true resistance measurements.

Due to the presence of capacitance in a battery cell, impedance values are obtained when injecting current into the battery. Thus, resistance readings are directly affected by the frequency of the input current injected into the cell. Since impedance is a two dimensional measurement of reactance and resistance, accurate resistance measurements are not possible by the impedance test. Impedance measurements are affected by the frequency of the injected current such that resistance measurements can be 3 to 5 percent off. In fact, the larger the frequency of the AC current injected, the larger the reactance and the less accurate the resistance measurement. For example, at 45 Hz, resistance measurements are known to be 80% the value of the resistance measured at 5 Hz. A particularly bad choice of test current frequency is 60 Hz in the United States and 50 Hz in the majority of the world, that being the frequency of normal outlet power. Due to the internal capacitance of a battery cell, low frequency current, e.g. 5 Hz, must be injected to reduce the likelihood of inaccurate resistance measurements affecting the overall cell integrity analysis. The lower the frequency the better the results wherein a DC input provides the most accurate resistance measurements. The problem is that most equipment used utilizes the 60 Hz power provided through all outlets and requires the battery or batteries be disconnected to perform true DC resistive loading testing as no batter testers known can perform DC resistance testing while the battery is in service.

Another problem with the impedance test is that inaccurate measurements are obtained because of the presence of noise in the battery charger and underlying circuit. Like other equipment, battery chargers used are operated with conventional AC or 60 Hz outlet power which creates noise affecting impedance measurements. Since cells must be tested under normal conditions, and while in service for meaningful measurements to be made, the battery charger remains connected during testing. This is undesirable because AC alternating current injection methods are susceptible to battery charger ripple currents and other noise sources especially with outlet power supplied at 60 Hz. In addition, some instruments cannot be used while the battery is in service and/or connected to the battery charger and load in normal full float operation. These frequencies, however, are often the only source of alternating current available and provide the primary charge ripple and noise source frequency. By way of example, it is not uncommon to have RMS ripple current in excess of 30 amps flowing through large uninterrupted power supply batteries. Moreover, it is simply undesirable to remove a backup battery from service to take electrical cell resistance measurements when that battery source is providing the insurance necessary in the event of main power failure.

Another measurement device employed for determining battery cell integrity is the conductance meter. This instrument is primarily used by the automotive market and performs essentially the same type of measurements as the impedance test equipment. The only difference between the impedance test and the conductance test is that the value displayed by the instrument is conductance rather than impedance wherein the two are inversely related. Consequently, the same problems are associated with the conductance meter as noted above as they both inject AC current through the battery under test.

The oldest test conducted under battery cells is the load test. This type of test simulates the load being powered and injects AC current through the battery under test. With this test the battery is still subject to noise from the battery charger, and is frequency sensitive. There are also DC loading tests which manually place a load across a battery. These tests, however, are incomplete, slow and must be manually performed. During a DC load test, the battery experiences an instantaneous voltage drop and then a recovery in voltage when the load is removed or floating. Therefore, to obtain an accurate measurement of the battery cell capacity, measurements for both loaded conditions and floating loads must be made and time must be allotted for battery voltage recovery. These drops in battery voltage are due to internal resistance and are often enough to make a difference in meaningful battery capacity predictions. Moreover, since battery modules often include many batteries connected in series by external intercell connectors, resistance measurements for predicting breaks are equally important but nonetheless neglected.

In accordance with the foregoing, instruments presently available use either AC current injection methods or momentary manual load tests. AC injection instruments, such as impedance or conductance meters, apply test signals through the battery and measure the resulting AC voltage. These readings vary with the frequency of the injected current and the value of capacitive reactance in the battery which in turn lowers the electrochemical resistance determinations made and their corresponding accuracy. Meanwhile the DC load test instruments available for measuring internal battery resistance in the cells do not account for normal cell voltage drops which occur in a battery when a load is applied across its terminals. The instantaneous drop when a load is applied, or the instantaneous voltage recovery when the load is removed, is due to the internal resistance. Currently, there are no DC load testing instruments which account for the instantaneous voltage drop and which can perform the instantaneous high speed calculations necessary for obtaining accurate resistance readings. This is because prior to the present invention there have been no battery testing equipment having analog to digital (A/D) converters or microcontrollers able to process the information, account for load applied voltage drops in the battery and make integrity measurements based on load and float voltages.

Consequently, the most reliable way to test a battery's capacity and ability to perform is to perform DC load test across the entire string of a battery module. Such a testing technique, however, has proven to be time consuming and inconvenient in the past because it requires a series of manual connections, measurements, recordation and calculations. Moreover, to accurately measure battery resistance and perform DC load testing, conventional techniques require the battery be disconnected from service and the charger removed. This, of course, compromises other important measurements as discussed herein. Therefore, DC load testing would be well received if automated test equipment was available which could automatically measure, calculate and log voltage, current and resistance data from individual cells subjected to load currents that match the normal operating load while the battery or batteries remain in service and are being charged. Such a load test could perform a 100% integrity check and identify existing problems with either the internal cells or the external intercell resistance paths without compromising backup battery power. Prior to the present invention, automated battery testing equipment as described has not been available. Therefore, automated test equipment capable of providing complete integrity checks on a battery cell performance criteria would be well received. Accordingly, the instant invention provides automated battery test equipment for storing data, performing calculations and ascertaining the integrity of battery cells automatically and which is also capable of downloading battery test data into computers for further case analysis.

SUMMARY OF THE INVENTION

It is an object of the present invention to provide an automated battery tester for determining battery cell integrity for one or more cells using DC load measurements.

It is also an object of the present invention to predict whether a battery source will be able to provide required power to a known load.

It is an additional object of the present invention to provide an automated battery tester for predicting battery performance based on internal cell resistance measurements and which may also perform as a multimeter.

It is a further object of the instant invention to provide an automated battery tester for determining battery capacity based on internal cell resistance measurements obtained by load testing the battery source and performing calculations from voltage and current measurements.

It is still an additional object of the instant invention to provide an automated battery tester for performing automatic load testing on battery cells, making internal cell resistance measurements, storing internal cell resistance measurements, and performing calculations for determining the battery voltage capacity with and without loading. It is still another object of the instant invention to provide an automatic battery tester which performs a DC load test to calculate internal cell resistance and intercell resistance.

It is still a further object of the instant invention to provide an automated battery tester which automatically stores data up to 8 strings and 260 cells each being performed in a time efficient manner and which guarantees a permanent record of readings.

It is yet another object of the instant invention to provide an automated battery tester which internally performs data analysis and displays internal cell resistance measurements, intercell resistance, temperature readings, specific gravity readings, voltage readings from the battery, underload, float voltage and overall battery capacity on an easy to read display.

It is yet an additional object of the instant invention to provide an automated battery tester which provides a display window design for easy reading of displayed instructions and results.

It is yet a further object of the instant invention to provide an automated data storage battery tester which provides substantially 100% battery cell integrity measurements while a battery is in service and fully connected to its battery charger.

It remains an object of the instant invention to provide an automated battery tester having serial port interface capabilities and computer interface compatibility for downloading storage data, menu options, instructions and/or other test information for further battery analysis.

In light of these and other objects the instant invention comprises an automated data storage battery tester and multimeter system for performing DC load testing on at least one battery cell or a plurality of battery cells (battery source module), while the battery or battery source is in service and being charged by its battery charger.

The foregoing objects are accomplished by the present invention which automatically performs DC load testing and internal cell resistance measurements while the battery remains in service and charged. A cell's internal resistance has proven to be a very reliable indicator of the state of health and capacity of a battery and it offers a cost effective solution to manual DC load testing and more reliable results than AC current injecting methods as conducted in the past.

The internal resistance of a cell is closely related to its capacity and therefore it can be used to predict the cell's performance during a discharge. A discharge is nothing more than the drawing of current and power from the battery. Therefore, the battery tester of the present invention performs DC load testing by automatically placing selected loads across the battery to draw a DC current and take voltage drop current draw measurements with and without the load in a predetermined timed sequence. The voltage and current measurements are used for arriving at internal cell and intercell resistance calculations. The battery tester disclosed performs the load and float voltage measurements with the battery and battery charger in service for resistance determinations without the side effects of noise, AC ripple, voltage drop and impedance.

Batteries must be periodically tested for cell integrity. As a battery loses capacity the internal resistance slowly increases over time. Once internal electromechanical cell resistance exceeds 25% of its nominal value cells are known to fail capacity tests. Even though there is a close correlation between a battery cell's internal resistance and its capacity, it is not completely linear. Therefore, the instant invention does not use the internal cell resistance measurements therefore are not used as a direct indicator of capacity, but rather as a warning indicator that signals whether a cell has deteriorated to a level that will affect the operating integrity of the battery. The instant invention also performs other tests to completely analyze and ascertain the health and integrity of the battery to predict its future performance. For instance, the battery tester measures intercell connector resistance to insure battery source or module integrity by checking for intermittent connections between series connected cells, or otherwise, for determining full power source capacity and for dangerous loose connections.

The battery tester of the instant invention measures internal cell resistance, intercell resistance, float voltages and load voltages, and records a cell's specific gravity and cell temperature from manual computer inputs. The instant invention stores data readings in a data storage RAM and also provides a scratch pad memory RAM for temporary storing of measurements used in performing calculations. The battery tester includes microprocessor readable algorithms for operating the hardware and making calculations. The software algorithm is stored in program ROM and updated software is stored in update ROM. The ROMs and RAMs are controlled by a microcontroller, or a microprocessor. A multiplexer (MUX) receives and sends voltage and current signal inputs to perform information switching and routing for software controls and commands and hardware manipulation. Switches, such as relays, solenoid relays or solid state relays, are used by the tester for applying loads, input dividing, and routing signals to RAMs, ROMs and the displays.

The instant invention measures load voltage, float voltage and current draw nd processes this data to compute internal cell resistance. The battery tester first places a predetermined and selected load across the battery drawing a measured DC current from the cell through that load. The load is selected by manipulating a corresponding switch, or keypad entry, which triggers a corresponding relay dropping the load across the required terminals automatically. By injecting DC current rather than AC current the noise and ripple side effects from the charger are not realized and a true load test may be accomplished while the battery remains in service. Load voltage and DC current draw are measured and recorded when injecting the DC current from the battery through the load. To measure float voltage, the load is removed, a short predetermined amount of time is allowed to pass, e.g. 30–40 m sec., and a float voltage reading is recorded. Thus, the no load voltage reading is recorded after removing the load. To arrive at the internal cell resistance, the battery tester software subtracts the float voltage reading from the load voltage reading and divides the difference by the current draw measured. The instant invention also provides for battery voltage drop through timed measurements.

The no load voltage reading is referred to as the float voltage, which is the battery voltage while the battery is charged without a load applied and this informs the user whether the charger is set or sitting at the right voltage when not in use. Reading a float voltage also helps determine whether a cell is suffering from a short, which would be indicated by a low float voltage measurement. Additionally, intercell resistance is measured and calculated by measuring the voltage drop across the intercell connect and dividing it by its current draw. All measurements and calculations, i.e. float voltage, load voltage, current intercell resistance, and internal cell resistance are stored in data RAM. Numbers used in calculating are also temporarily stored in scratch pad memory RAM.

In the preferred embodiment of the instant invention, the data storage battery multimeter may be used on a single cell or a multi-cell module. Readings up to 8 strings at 250–260 cells each can be stored in the battery tester multimeter in a RAM location having preferably two megabyte capacity. These numbers are merely examples and are not intended to limit the scope and spirit of the invention.

The preferred embodiment of the instant invention provides a self contained, battery powered unit preferably comprised of a microprocessor or microcontroller, adjustable selectable load resistance, a display and a rechargeable battery. The instant invention may be powered by AC wall adapters and also provides backup battery power. The microcontroller may be defined as a microprocessor including the RAM and ROM memory capacities for data and program storing, respectively. The instant invention may include two sets of test leads where the first set is a standard set of digital voltmeter probes for voltage reading and the other set is a pre-clip set used in the multimeter mode for other measurements. The second set is used for making internal cell and intercell resistance readings. To obtain an internal cell resistance integrity measurement, the second set comprises two dual connected test clips which are connected across the cell and its associated intercell connector, that is from the positive post of the cell being tested to the positive post of the next cell. The dual conducting clips provide two different conductive paths are provided, one for applying a load through the clips and the other for taking measurements. The intercell connector is a conductor link used to connect the negative terminal from one battery (such as the cell being tested) to the positive terminal of another (such as the next cell) to connect the batteries in series for increased battery voltage or power capacity. Thus, the two dual conductor test clips are connected from the positive post of one cell being tested to the positive post of the adjacent series connected cell. A third single conductive clip is connected to the negative terminal of the cell being tested. These connections allow the voltage drop across the cell being tested and the voltage drop from one cell to the next cell to be taken. The voltage of the cell and the voltage drop of the intercell connect are determined by subtracting one measurement from a corresponding measurement.

Once connected, the user initiates the test sequence by first reading and recording the cell float voltage. Once again the float voltage is a no load voltage test reading which helps ascertain whether the battery charger is set or sitting at the correct voltage and determines whether a cell is suffering from a short circuit. In the load test, which subsequently follows, the battery tester automatically connects by keypad or keyboard commands a fixed load resistance across the cell and the intercell being tested forcing a current of approximately 70 AMPS to flow from the battery through the load for a few seconds. During this load condition, the instant invention reads the current and voltage flowing through the intercell conductor and the current and voltage across the internal cell to determine the intercell connection resistance and the internal cell resistance, respectively. These resistance measurements are easily obtained by dividing the voltage readings by the current readings which are stored in and pulled from RAM.

Data extraction and analysis is possible with the instant invention wherein the battery tester is connectable to a PC compatible computer. The instant invention provides subroutines for data extraction wherein the test results are downloaded through a serial port cable into the computer program. The test results may be imported into the program of the instant invention and the data analyzed and displayed in an easy to read bar graph or tabulated format. In one alternative, the tabulated test results can be saved in an ASCII or command, delineated format enabling the user to use commercial, or off the shelf programs to generate customized reports. In any event, once the float voltage and load voltage readings are obtained from the test, the battery tester multimeter may download the resistance reading and other data readings or calculations to a standard personal computer through a serial port. This is done by connecting the tester to a standard personal computer via a conventional serial port, such as the RS-232. Once the serial port connection is made, the instant invention provides a downloaded menu driven program into a computer for further data extraction, analysis and reporting. Thus the data may be further analyzed and used to create easy to read graphs and printouts from the personal computer. A computer however is not necessary for obtaining the necessary readings, or determining the battery cell integrity, or battery capacity. The instant invention generating reports and displays standard analysis measurements, such as internal cell resistance, intercell connection resistance, cell float voltage, low load voltage, cell specific gravity and cell temperatures, among other readings.

A summarized account of the instant invention features includes float voltage readings, internal cell resistance measurements, intercell resistance measurements, auto ranging, data extraction and analysis, system display, and battery power. The float voltage readings measures the voltage applied during full float operation where no load is applied. The voltage range covers all cell or cell modules up to 16 volts, and reading accuracy is within preferably four full digits. The battery tester circuitry is designed for handling and processing a limited voltage, such as four volts, therefore the instant invention may incorporate a voltage divider or input divider circuit for cutting down proportionately the input voltages for data manipulation. As noted above, the internal cell resistance is ascertained by measuring the cell's response to a momentarily applied load across the cell. The instantaneous voltage drop experienced by the applied load and load current drawn is used to calculate the resistance. The battery test hardware and software algorithm perform calculations to arrive at the measurement. The instant invention also takes these measurements and uses it for floating on line analysis. This helps to determine weak, and potentially failing cells when comparing the internal cell resistance of all the like cells in the string of cell modules. The instant invention also measures and displays the total electrical resistance of the intercell conductor connection between the terminals of adjacent cells, or the intercell connection that are connected to each other. This measurement includes the resistance of the intercell connector and the contact resistance with the posts or cell terminals. Since the instant invention is software driven, the battery tester is able to automatically select the correct voltage range and load resistor for the test being performed. The instant invention may be able to do this by taking preliminary voltage measurements of the cell or plurality of cell modules being tested to select a voltage range. The battery tester preferably provides four digits of accuracy for all measurements.

Instructions and test results are provided on the battery tester unit display or downloaded to a computer for computer display. The display window of the instant invention preferably maintains a four line by 20 character display. The instant invention may be powered by a self contained, rechargeable battery built into the case of the instant invention. The self contained rechargeable battery may be recharged or the unit may be set up for AC power operation from a wall plug transformer modular.

The instant invention provides a first set of probes and is designed so that it may also be used as a volt meter or multimeter. The battery tester also signals when probes are properly connected across a cell's terminal post by showing the voltage reading on the display and emitting an audible beep within two seconds. A display indication that the reading has been stored in the unit's RAM memory may also be done. When the two voltage probes are lifted for measuring the next cell in the series, the instrument automatically indexes the display and memory stack to the next higher number when the voltage probes make contact with the next cell. The instant invention and software employ conventional pointer indexing means in the microcontroller and RAM registers. By automatically indexing display and memory storage positions, the instant invention allows a user to make valid recorded voltage readings at a rate of preferably 10 to 12 per minute.

Specific gravity and temperature measurements may be made by the instant invention and displayed. To measure specific gravity and temperature of a cell or cells, the display via software may prompt the user to key in the reading for each cell. The instant invention automatically inserts the first two numbers of a specific gravity reading to speed up the entry process. For example, for a 1215 reading the display may show SG equal to 12—and the user enters 15. These readings may be automated in the future but in the meantime this process is still more efficient than the present pen and paper approach. Thus, the invention merely allows for the recording of the specific gravity and temperature within the modular so that it may be used in future calculations and/or downloaded into a PC compatible computer.

The preferred embodiment of the instant invention includes an A/D converter, such as those conventionally known for converting readings from analog to digital for calculating, processing and storing in the permanent or temporary RAM locations. The A/D converter employed by the instant invention effectively enables the measurement of DC values while totally ignoring any AC signals flowing through the battery at the same time or other signals which may be attributed to noise. This is another way the instant invention is capable of on line operation even in high noise environments.

The instant invention may be used on any type of batteries and is able to predict capacity reduction based on various battery conditions such as corrosion, grid growth, sulfation, dry out, manufacturing defects, various charge conditions and temperatures.

In accordance with these and other objects which will become apparent hereinafter, the instant invention will now be described with particular reference to the accompanying drawings.

DESCRIPTION OF THE PREFERRED EMBODIMENTS

Figure 1:
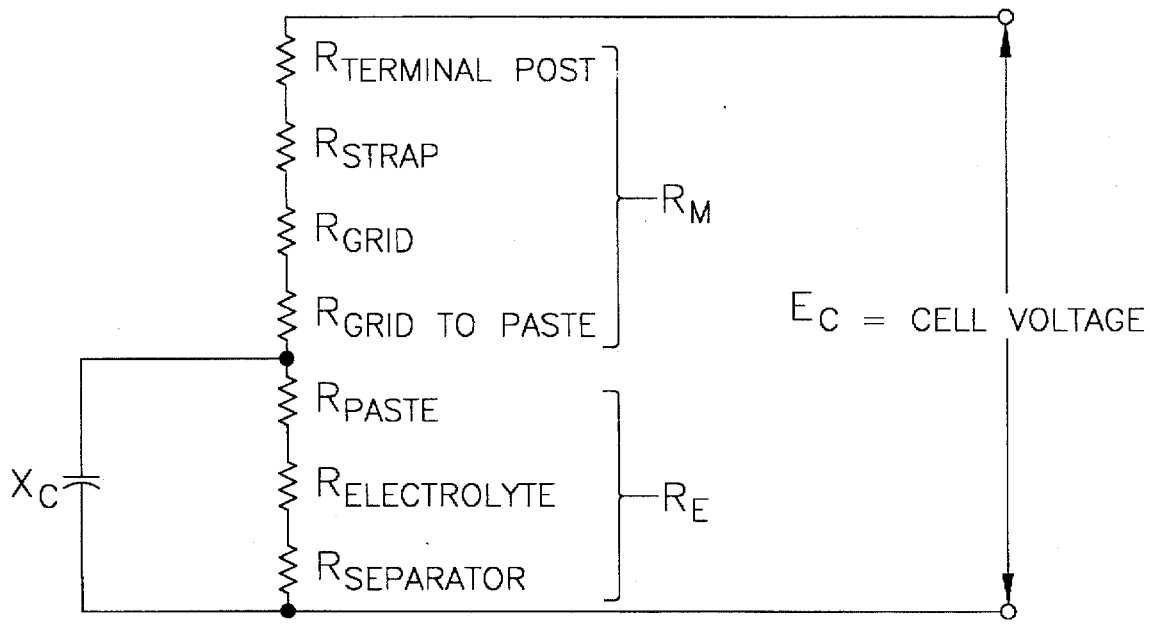
FIG. 1 is a circuit representation of conventional batteries illustrating the metallic resistance and electric mechanical resistance of the battery cell and the capacitance.

With reference to the drawings, FIGS. 2–6 depict the preferred embodiments of the battery tester system 10 which generally comprises a data storing battery multimeter 10 for measuring, recording and displaying readings of internal cell voltage, internal cell resistance and intercell connection resistance. Other data specific to each battery being tested may be manually entered and stored in the battery tester 10, such as specific gravity and temperature. The instant invention is an automated microprocessor or microcontroller operated testing and display unit for processing and displaying the foregoing measurements. The instant invention is preferably computer compatible whereby it may be electrically linked to a personal computer 230 or network for downloading or extracting data recordings from the tester obtained by the tester 10 during testing for further analysis and report generation. The battery tester 10 may be used for automatically testing a single cell 5 or multicell battery source module. Large industrial type backup DC battery sources typically include a plurality of battery cells 5 electrically connected in series by intercell connectors.

The preferred embodiment of the instant invention is a self contained, battery powered unit 10 comprising a microcontroller 130 or microprocessor with internal or external RAM, ROM and a timer, load resistance circuit 20, a display 110 and rechargeable battery 210. The tester 10 of the invention measures float voltages, internal cell resistance, intercell resistance and load voltages for at least one battery cell 5. Float voltage is a measurement of battery voltage during full float operation wherein no load is applied and the cell is charged. The internal cell resistance test determines the internal resistance of a battery cell 5 by how that cell responds to a momentary load 20–26. The instantaneous voltage drop across the cell and load current are measured and used by the battery tester 10 to calculate the cell's internal resistance. The battery tester 10 provides microprocessing hardware and software algorithms, such as that shown in FIG. 6, which make the measurements possible on battery cells that are floating and that have loads while they remain on line. That is, unlike the background systems, the battery tester 10 performs DC load testing while a battery cell or modular of cells are in service and while the battery charger remains electrically connected and powered. Intercell resistance is a measurement of the total electrical resistance of the connection 7 electrically linking two battery cells. This connection is usually a conductive link 7 from the positive post of the cell being tested to the positive post of the electrically linked or next cell. The intercell resistance test checks for bad connections. This is important for finding intermittent intercell connections, dangerous heat build up, voltage drops occurring between cells (a problem which can cause a loss of energy in critical testing or operating applications such as in telephone systems where small voltage drops can result in significant system failure), and dangerous conditions caused by intermittent connections such as electrical fires.

Figure 2:
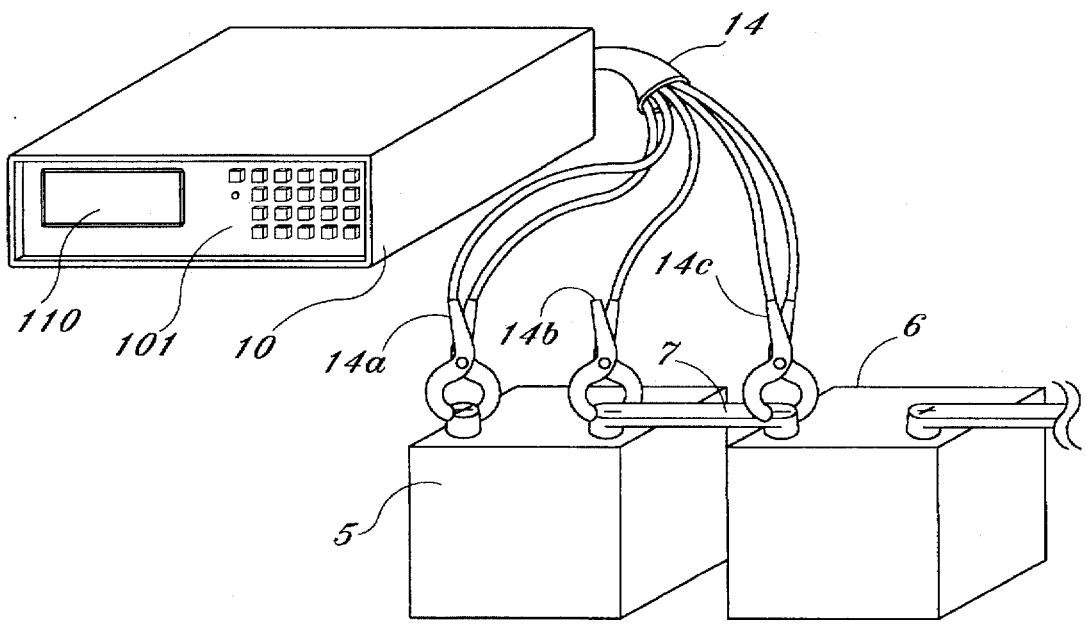
FIG. 2 is a simple pictorial diagram of the battery tester of the instant invention connected to the battery cell and module being tested.

The battery tester 10 may provide two sets of test leads, or two sets of test leads connectable to the tester may be used with the instant invention for making the foregoing measurements. One set, or the first set, is a standard set of digital voltmeter probes, while the second set 14 comprises a three clip set used in the multimeter mode of the battery tester, as seen in FIG. 2. The three clip set comprises two dual conductor test clips 14a, 14c and a third single conductor clip 14b. In the two dual conductor test clips a conductive element is situated in each leg of each clip so two conductive paths are provided. One path in each of the two clips allows a lead to be connected between the positive terminal of two battery cells via inputs 56 and 58, while the second path allows voltage measurements and/or current measurements to be made via inputs 50 and 54. The two dual connector test clips are used for connecting across the cell 5 being tested and its associated intercell connector 7 making the electrical link from the positive post of the cell being tested to the positive post of the adjacent cell. The third single conductor clip defined by the second set is used for connecting to the negative terminal of the cell being tested for measuring voltage drop and/or voltage across the cell being tested and the intercell connector via input 52. From these connections the instant invention may be utilized for making the foregoing measurements. Once connected, the user initiates the test sequence. First, the battery tester 10 measures and records the cell float voltage before the load is applied. Next, the battery tester 10 applies or connects a fixed resistance load 21, 26, and 22 or 24 across the cell being tested and the intercell being tested, forcing a current of approximately 70 amperes from the battery to flow for a few seconds through the load. Preferably, either a 2 volt, 6 volt or 12 volt load is applied. These leads are selected by triggering automatically either relay 21a, 24a or 26a, respectively. During this loaded condition, the battery tester 10 reads the current and voltage drawn which is necessary to calculate the intercell connection resistance and the internal cell resistance. When testing is completed, the user may connect the battery tester 10 via a serial port 180, such as RS-232, into a standard PC compatible computer and initiate the software algorithms of the instant invention. The software imported is menu driven for extracting data and making analysis and report profiles as supplied by the instant invention. Once data is extracted from the battery tester 10 the information may be displayed in an easy to read format on the accompanying computer 230 being used. However, the user may merely use the battery tester 10 as defined to generate a report and analysis and use its display 110. In the alternative, a user may download the software defined by the instant invention into the PC for operating the instant invention. However, it is preferred that the battery tester 10 be used for conducting the load and no load voltage measurements and the resistance calculations once the connections are made and then subsequently transferring the data stored in the tester 10 to the serial port linked computer.

The battery tester 10 provides the hardware and software algorithms for conducting the above-noted measurements. Therefore, the instant invention comprises ROM 140–150, RAM 160–170 and microprocessing hardware. In the preferred embodiment, the instant invention comprises a resistance loading device 21–26, load module driver circuit 80, a parallel input/output controller (PIO) 92 and circuit 90, a microcontroller 130, program ROM 140, upload program ROM 150, program RAM 160 which may include a temporary memory RAM, data storage RAM 170, address decoder circuit 120 for interfacing and communicating with the noted ROMs, RAMs, microcontroller 130, and PIO 92, an input divider circuit 40 and pre-AMP circuit 30, a multiplexer (MUX) 60, and an A/D converter circuit 70 system. The instant invention may also include a display 110, keyboard 101 and a keyboard decoder 100 which interfaces with the PIO 92. In addition, the invention includes a backup power supply 200, including a battery 200 and battery charger 210. In short, the essential elements of the instant invention are the microcontroller 130, at least one ROM 150, at least one RAM 160, a PIO controller 92, an A/D converter 70, and an adjustable resistance load circuit 20 which may be interchangeably applied for different load levels.

With reference to FIG. 2, a simple diagram illustrates the complete unit of the instant invention 10 connected or linked by the three clip set or second set 14 to a cell 5 being tested, the intercell connectors, and the corresponding adjacent cell 6. As can be seen with the second set, one clip 14a is connected to the positive post 5a of the cell being tested, the second clip 14b is connected to the negative post of the cell being tested, and the third clip 14c connected to the positive post of the corresponding cell 6. These connections allow the battery test instrument 10 to test and read float voltage, cell load voltage, current draw, intercell voltage drop, and intercell and internal cell resistance as calculated from the voltage drop and current draws. The current draw is really the current drawn from the battery as caused by the load applied.

Figure 3:
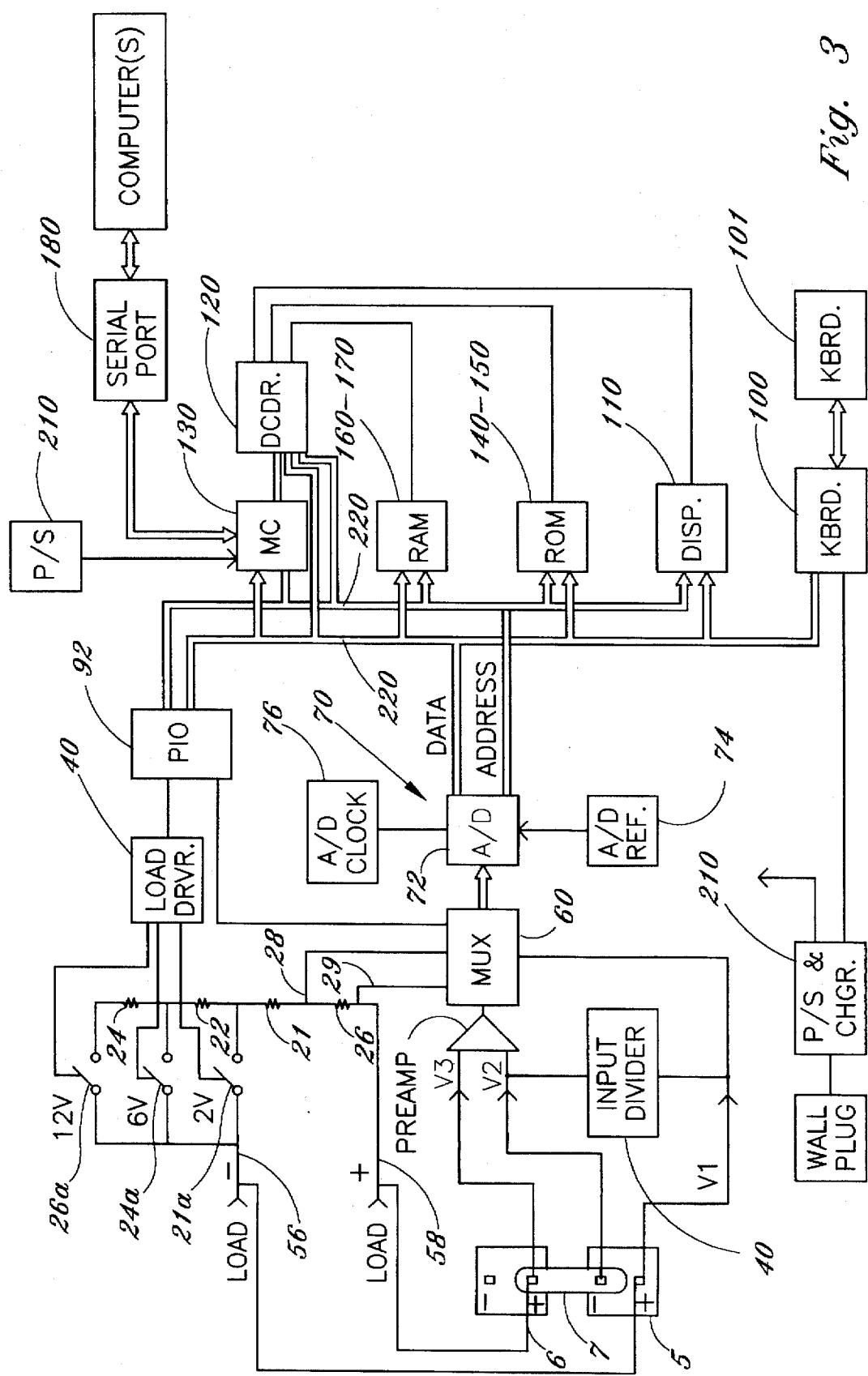
FIG. 3 is a block diagram of the preferred embodiment of the battery tester of the instant invention illustrating the interconnections between the hardware devices and the battery cells being tested.
Figure 4:
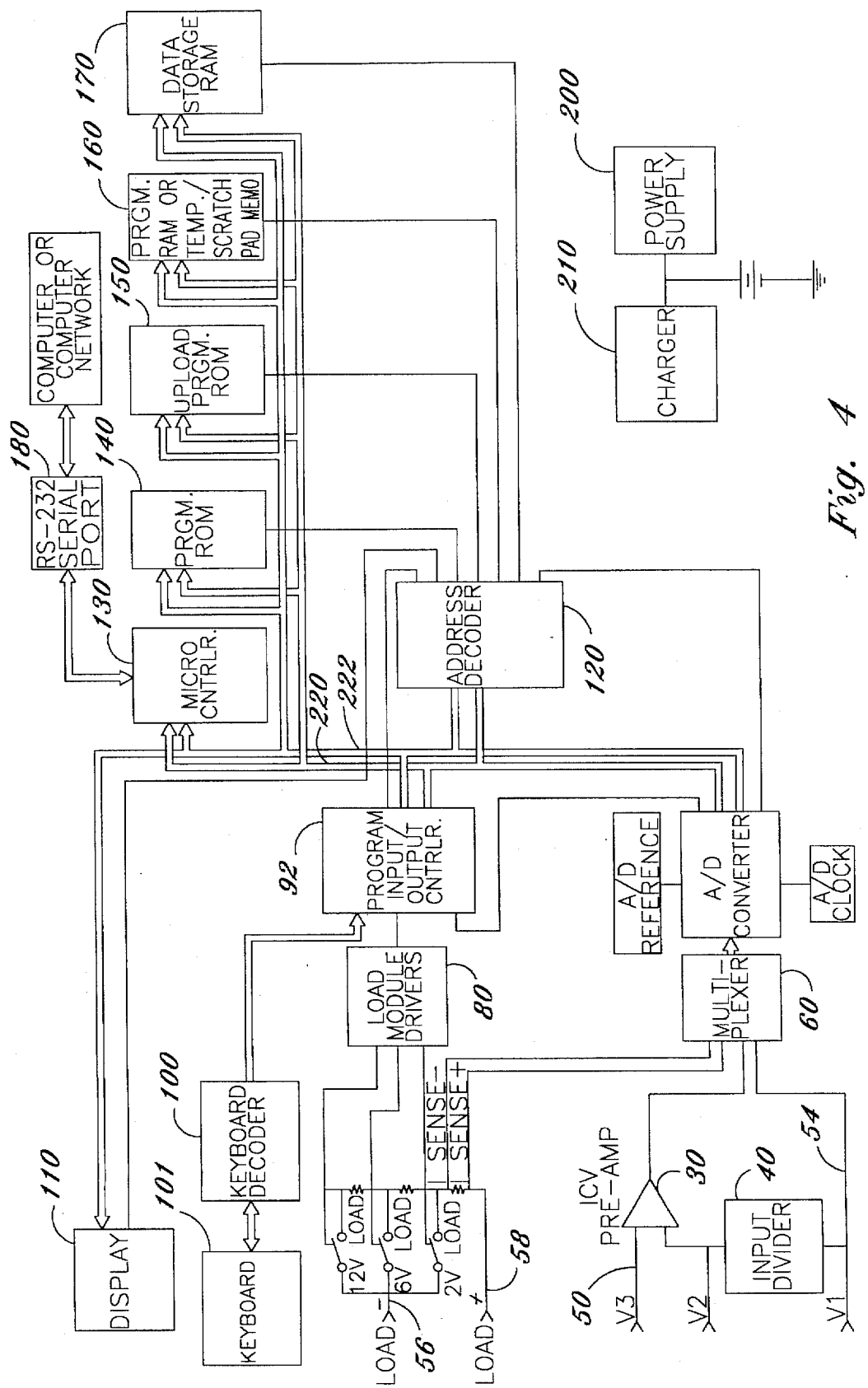
FIG. 4 is a block diagram of the preferred embodiment of the instant invention illustrating the hardware in more detail and the communication links between the integrated circuit chips of the instant invention.
Figure 5A:
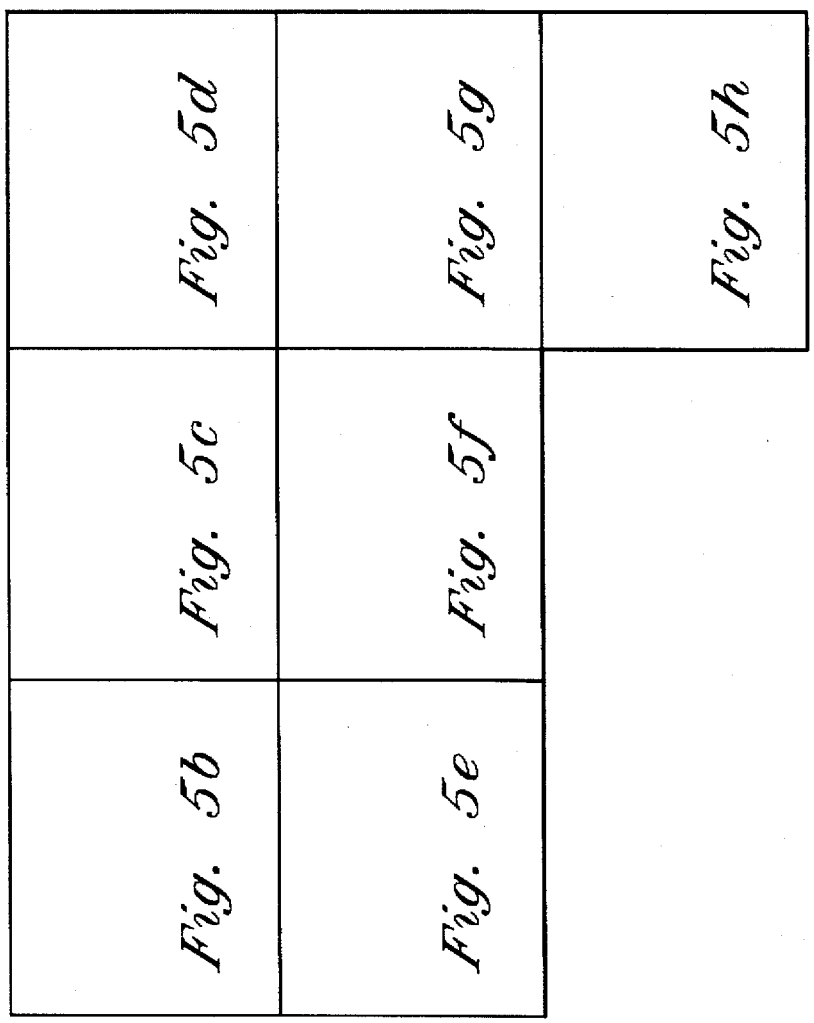
FIGS. 5a–5h is a detailed electrical schematic diagram of the preferred embodiment of the instant invention.
Figure 5B:
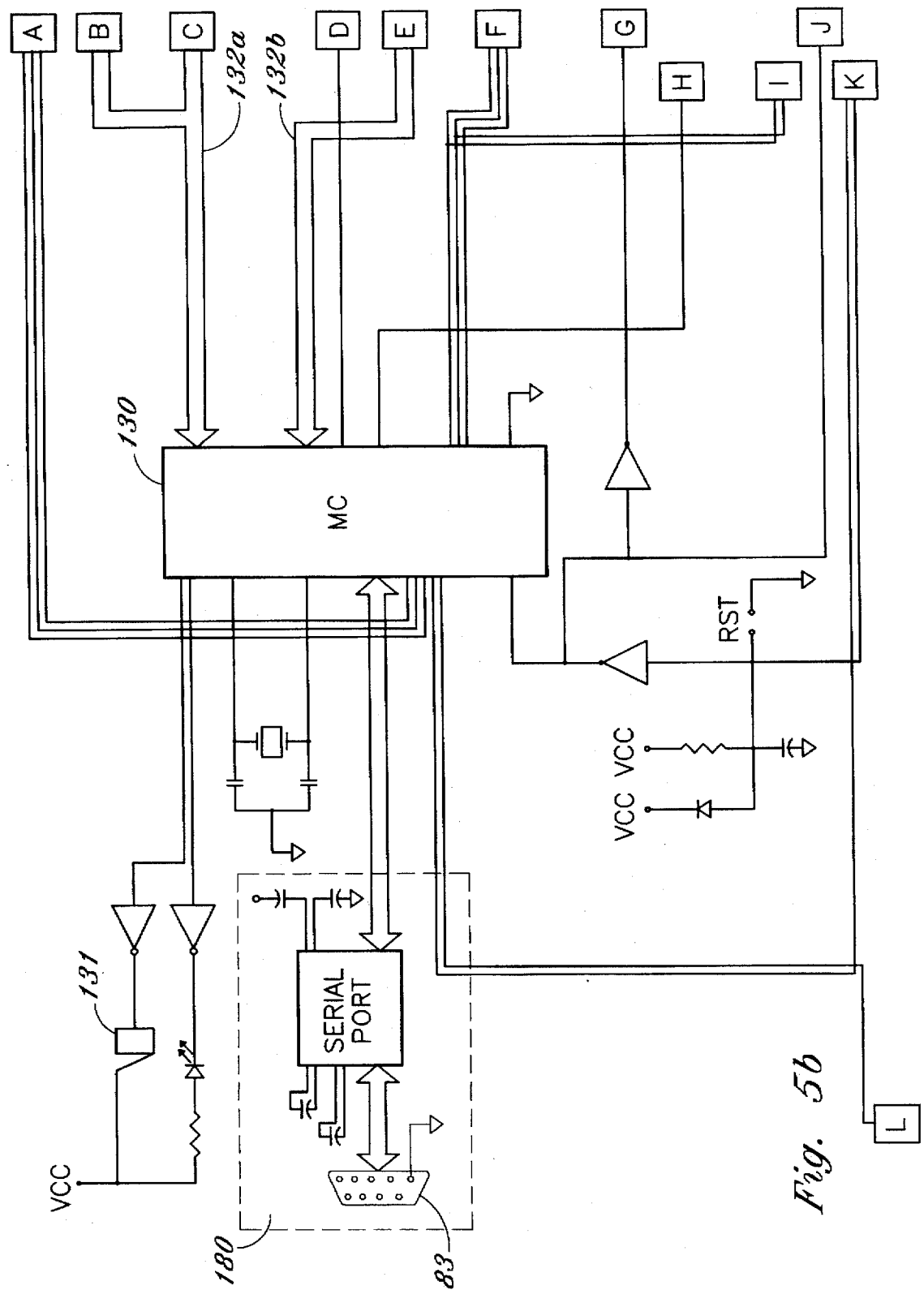
Figure 5C:
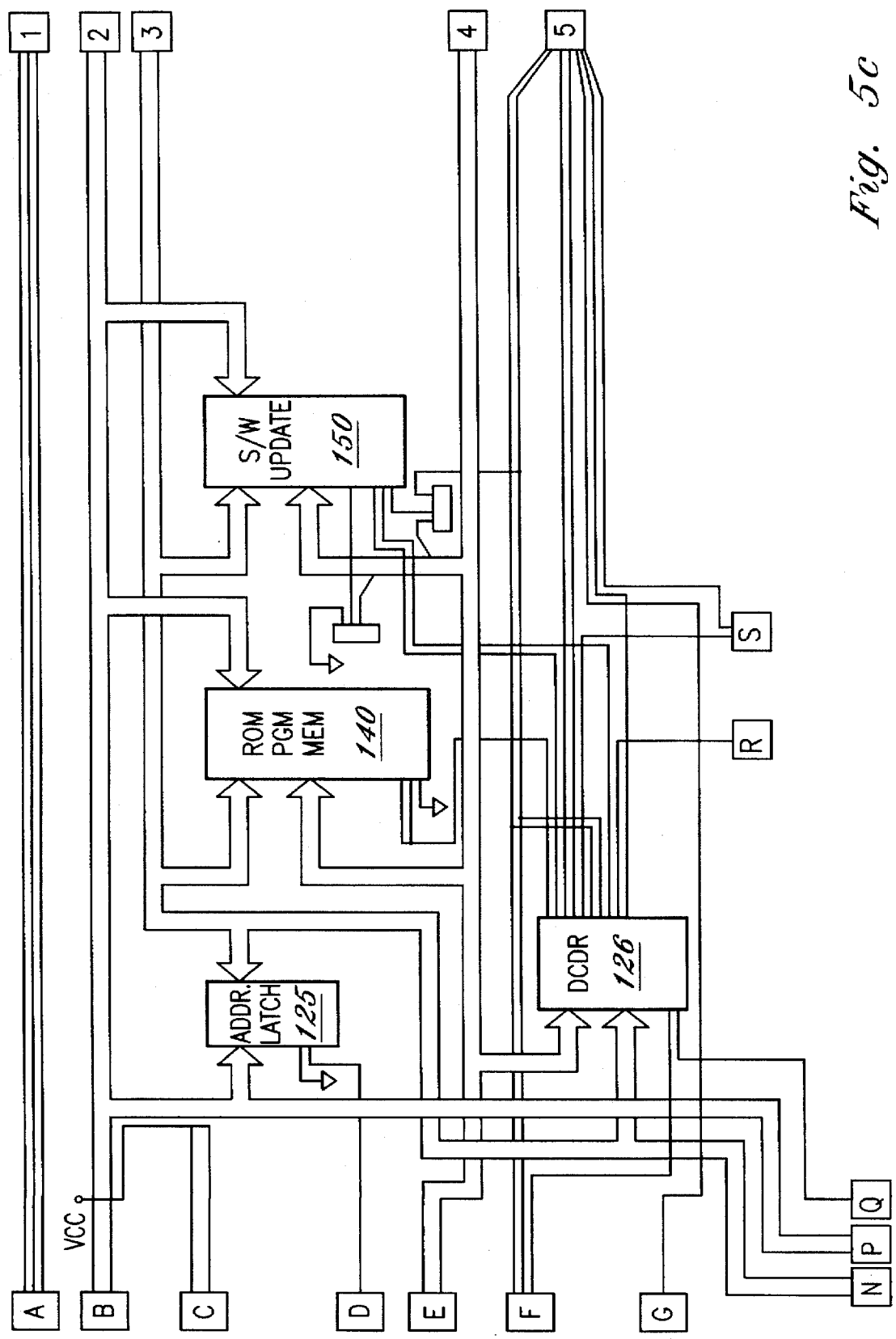
Figure 5D:
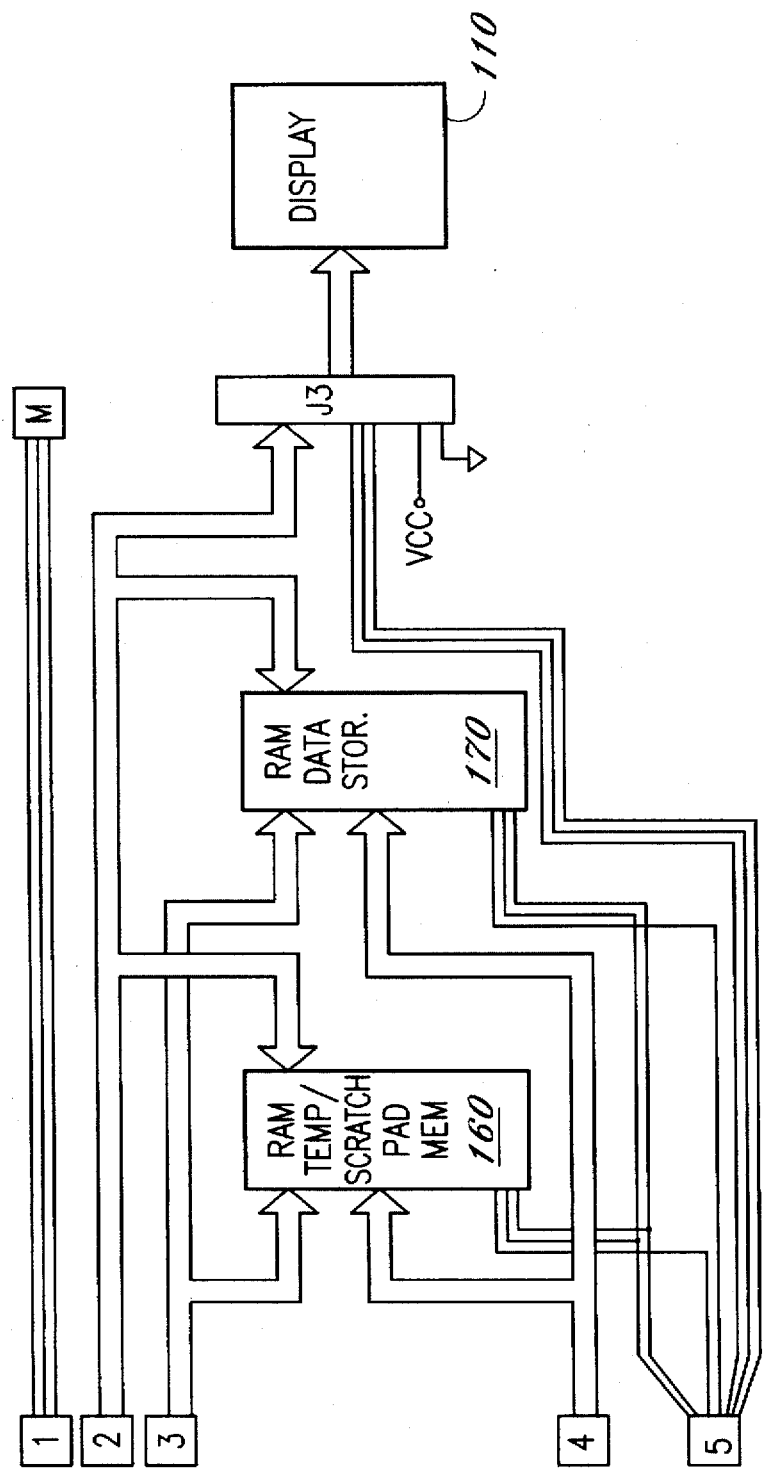
Figure 5E:
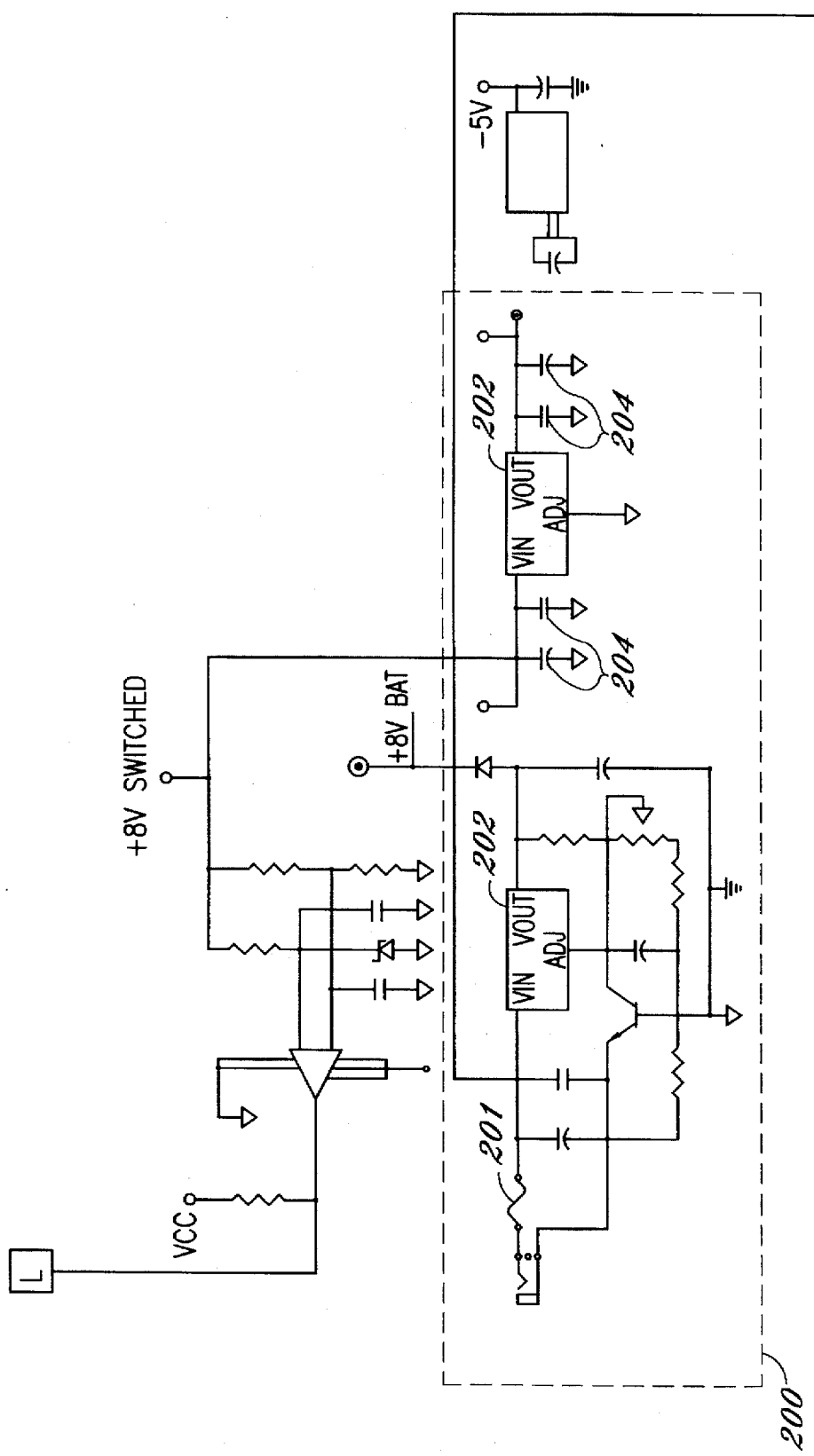
Figure 5F:
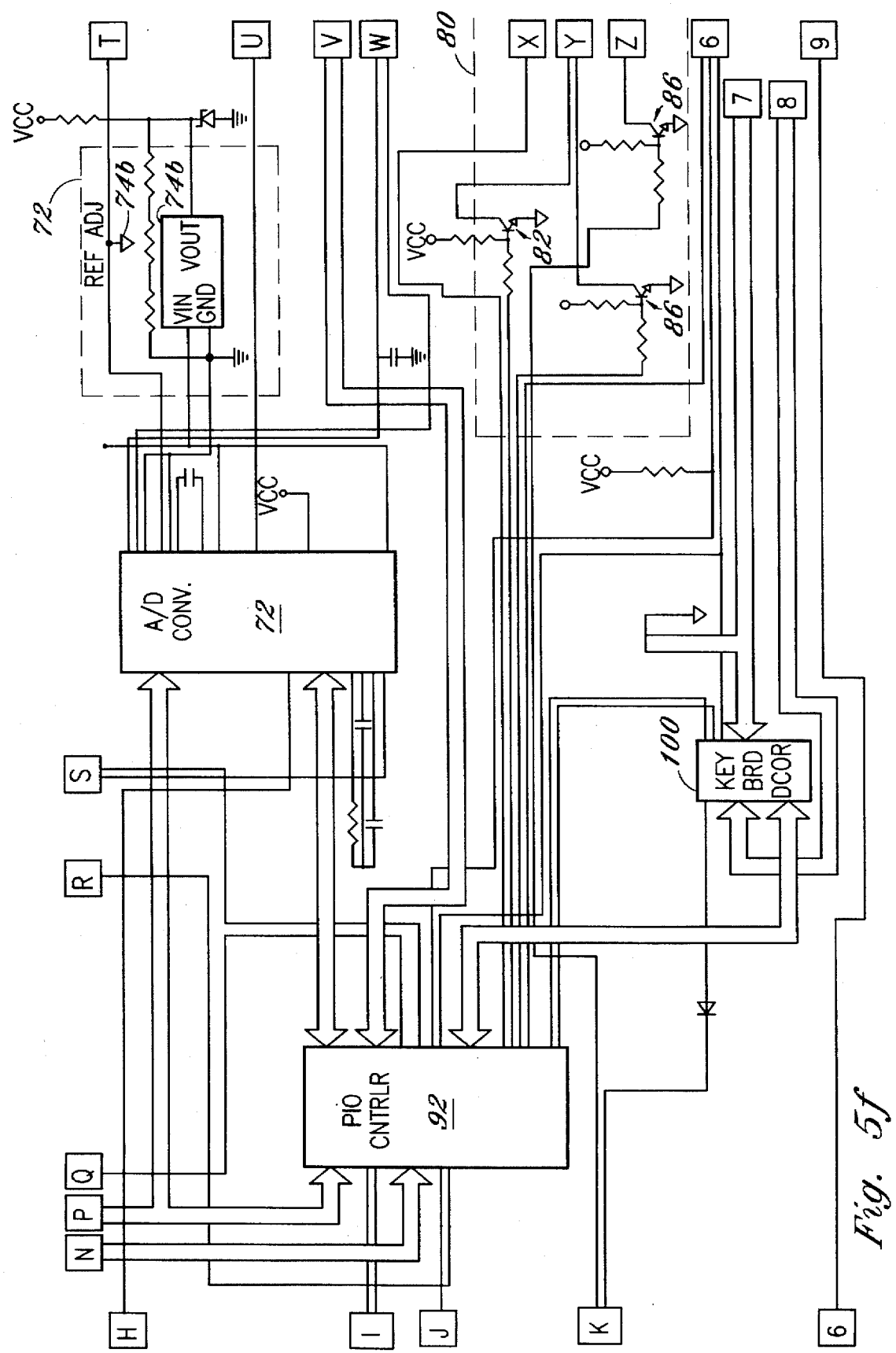
Figure 5G:
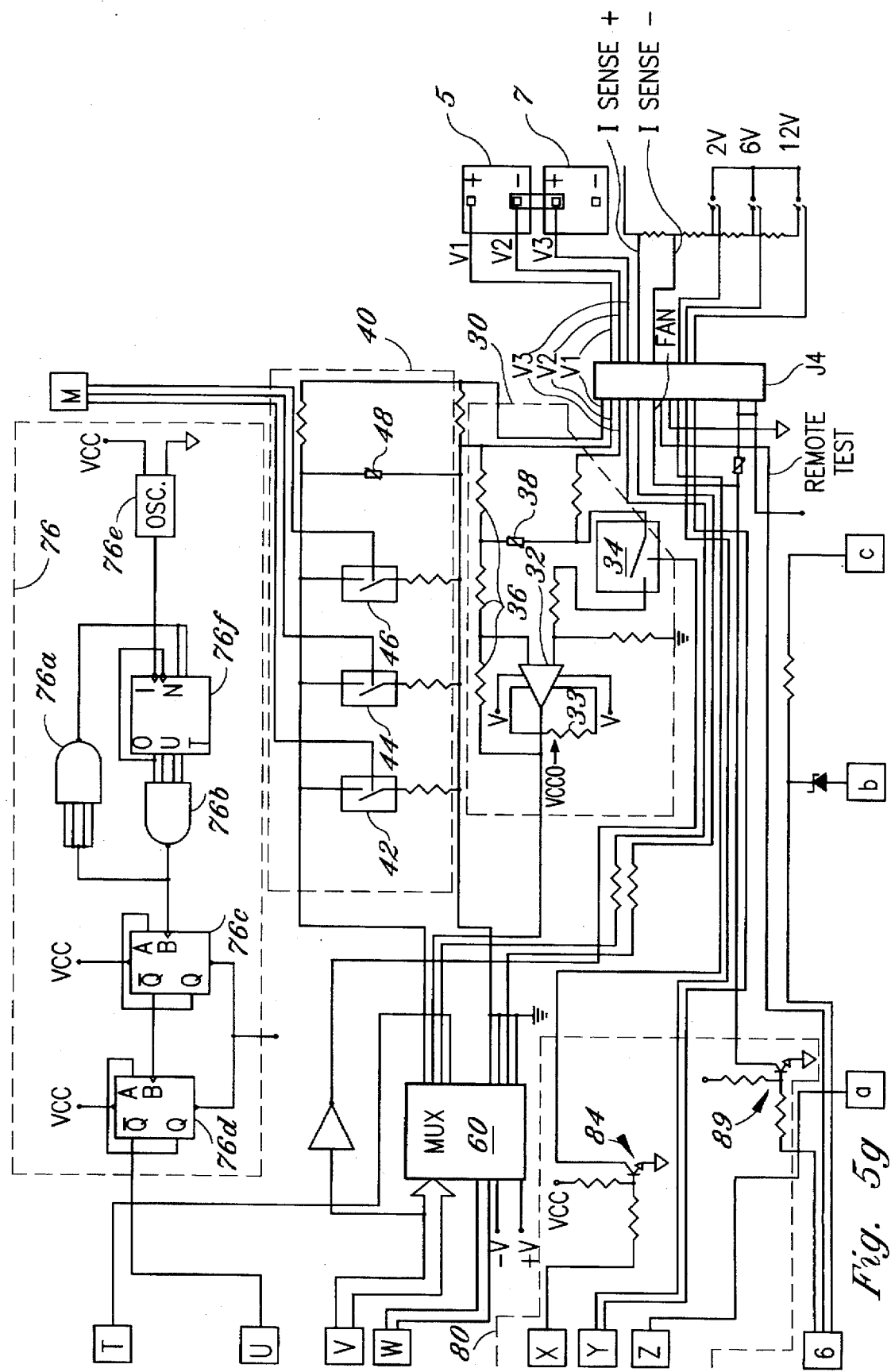
Figure 5H:
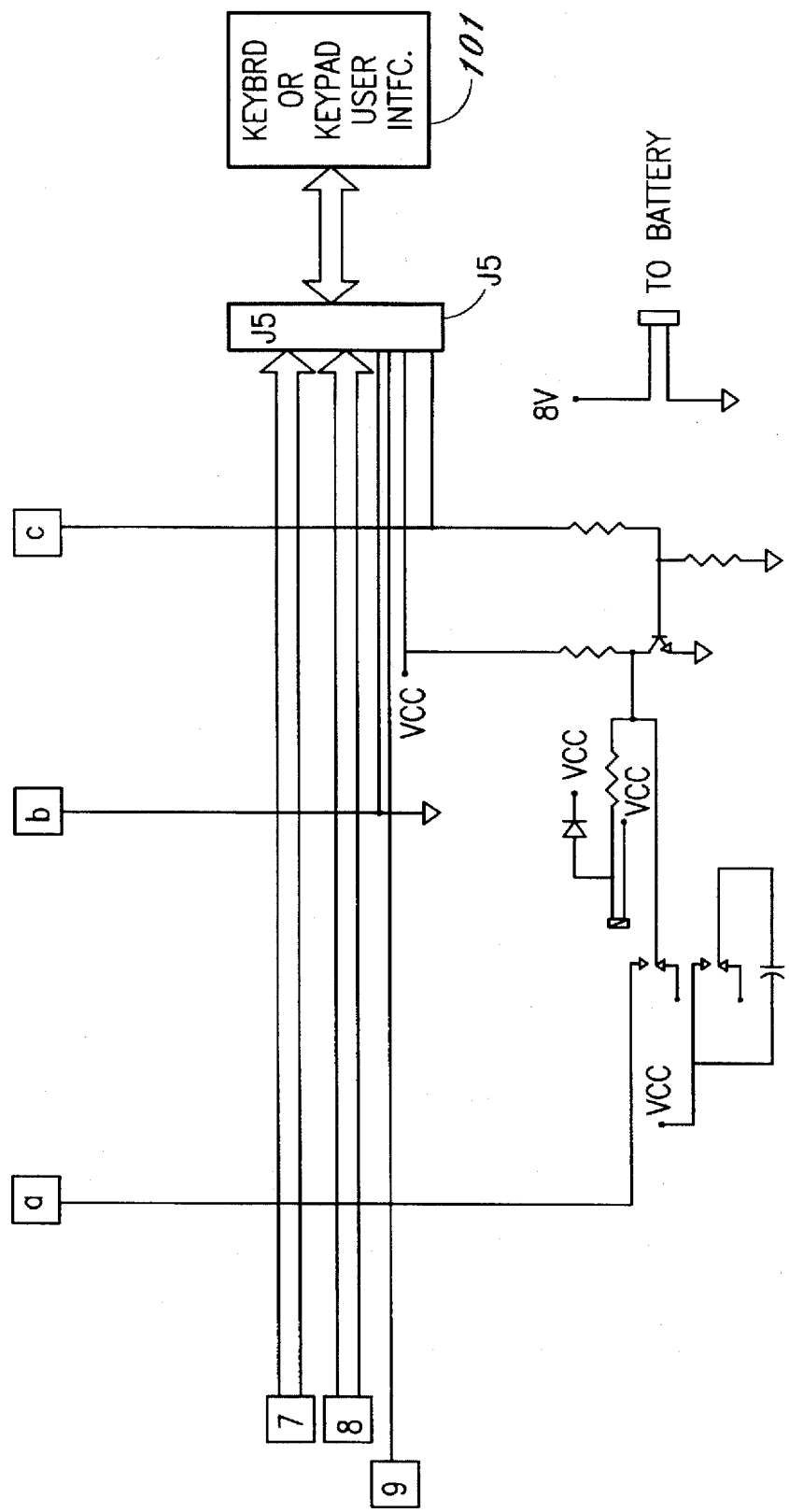

With reference to FIG. 4, a more detailed block diagram of the hardware of the battery tester 10 is shown, illustrating the input divider circuit 40, pre-AMP circuit 30, multiplexer 60, resistance load circuit 20, load driver circuit 80, PIO 92, analog to digital (A/D) converter 70, microcontroller 130, RAM 160–170, ROM 140–150, the display 110, the keyboard decoder 100, the keyboard 101, the RS-232 serial interface 180 and the power supply. The input divider circuit 40, shown in FIG. 3, is electrically coupled in shunt across the positive and negative terminals of the tested cell 5. This coupling shunt actually occurs between the tested cell V1 input 54 and the V2 input 52 which correspond to the positive terminal post and negative terminal post, respectively, of the tested cell 5. The input divider circuit takes the voltage input from the tested cell 5 and reduces it by voltage dividing circuitry to a level below a predetermined threshold, e.g. for volts, so that it may be received, read and processed by the A/D converter. The input divider circuit 40 receives voltage inputs from cell 5 and reduces them to the preferred DC voltage. The input divider circuit 40 is designed to receive up to 16 volts and reduces inputs to a maximum voltage of 4 volts. These levels have been selected since most batteries used today do not exceed 16 volts as higher voltage requirements are obtained by connecting battery cells in series. Therefore, the input divider circuit 40 may be designed for receiving higher direct current voltage inputs without departing from the scope and spirit of the instant invention. The pre-amp circuit 30 comprises an amplifier circuit electrically shunted across the intercell conductor link 7 for receiving, amplifying and measuring the voltage drop across the intercell conductor 7. As shown in the figure, the pre-amp 30 is connected to the V2 input 52 and the V3 input 50 which correspond to the negative terminal post of the tested cell 5 and the positive terminal post of the series connected cell 6, respectively. The pre-amp circuit 30 simply amplifies the DC voltage drop input received from the drop across the intercell since the drop is normally low and requires amplification for accurate processing.

The multiplexer circuit 60 comprises a conventional MUX integrated circuit chip which selects inputs in a predetermined order dictated by the system's software and PIO controller for routing to the A/D converter. The MUX 60 includes a plurality of solid state relays, or similar relays, which are sequentially triggered as determined by the software and PIO controller and outputted to the A/D converter. The outputs from the pre-amp circuit 30 and the input divider circuit 40 are fed into the MUX 60. In addition, the current sense lines from the positive and negative load inputs 58, 56 respectively, as shown connected to the load resistor 26, are also fed into the MUX 60. The A/D converter circuit 70 merely converts analog inputs to digital outputs for processing by the rest of the circuit components such as the PIO controller 92, address decoder 120, the microcontroller 130 and the ROM and RAM storage locations 140–170. The A/D converter circuit 70 includes an A/D reference circuit 74 and an A/D clock 76. The A/D converter circuit 70 comprises a conventional analog to digital converting circuit which utilizes A/D reference inputs and A/D clocking for referencing analog to digital conversion and timing.

The load circuit 20 provides a series of resistive loads including preferably 2 volts, 6 volt and 12 volt loads for placement across the V1 and V3 terminal post, i.e. the positive terminal post on the tested cell 5 and the positive terminal post on the series connected cell 6, via positive and negative load inputs 58 and 56, respectively. These loads are placed across the positive terminal post of the series cells for drawing current and taking current sense measurements via current sense lines 28 and 29 electrically tapping to load resistor 26 as shown in FIG. 3. These loads may be user selected from the keyboard or keypad 101 or automatically selected via the software and PIO controller 92. The loads in the loading circuit 20 include a 2 volt relay 21a, a 6 volt relay 24a and a 12 volt relay 26a which are electrically coupled to and responsive to the load driver circuit 80. The load driver circuit 80 controls these relays 21a, 24a, and 26a while the load driver circuit 80 is controlled by outputs from the PIO controller 92. That is, the load driver circuit 80 and the PIO controller 92 are electrically interfaced as are the load driver circuit and the resistive load circuit 20.

The PIO controller 92 is also electrically coupled to the multiplexer's circuit 60, for controlling the same. The PIO controller 92 further receives outputs from the keyboard decoder 100 which receives its inputs from the keyboard or keypad 101. The PIO controller 92 is also electrically interfaced with the microcontroller 130, the A/D converter circuit 70 and the address decoder circuit 120 via 16 byte and 8 byte address bus and data bus links, respectively, 220, 222, for transferring control and data signals. The PIO controller 92 is a programmed input and output controller for controlling inputs and outputs from the A/D converter 72, the keyboard decoder 100, the multiplexer 60, the load driver circuit 80 and the ROM and RAM locations 140–170. The PIO controller 92 may be a conventional program input and output integrated circuit chip. The PIO controller 92 may be further defined as a parallel input/output integrated circuit which provides additional input and output lines for transmitting non-communication busses capable of handling 8 byte to 32 byte words such as those from the load driver circuit 80 which turns on select relays.

The keyboard decoder 100 is electrically interfaced, preferably by a multilink cable or bus to the keyboard or keypad 101 for receiving and decoding input from the keyboard 101 for running tests as dictated by the user. The keyboard or keypad is accessible by any user from the outside of the unit enclosure casing as shown in FIG. 2. The keyboard decoder produces outputs which electrically interface with the PIO controller 92. Furthermore, the keyboard decoder outputs are electrically connected to the microcontroller at select pin connections on the keyboard decoder integrated circuit chip and the microcontroller for processing user interface inputs.

The microcontroller 130 of the instant invention, as shown in FIGS. 3 and 4 electrically interfaces and controls signal and data processing to the program ROM 140, the upload program ROM 150, the program RAM 160, the data storage RAM 170, the address decoder 120, the display 110, the A/D converter 72 and the PIO controller 92 based on selected inputs from the keyboard decoder 100, the PIO controller 92, the address decoder 120, the information serial port 180 and other inputs as shown in the detailed circuit diagram of FIG. 5. The microcontroller may be described as a microprocessor having internal RAM, ROM and timer circuitry which in most conventional microprocessors is outside the integrated chip. The microcontroller 130, as shown in the instant invention, interfaces with the program and data ROM and RAM locations as shown. In the alternative, a conventional microprocessor may be utilized for accomplishing the same results. The microcontroller 130 also interfaces with an address latch integrated circuit 125 which is comprised in the address decoder 120 shown in FIG. 3 and FIG. 4. Referring to FIG. 5, the address latch is shown electrically interfaced to the microcontroller 130, the address decoder 120 and the PIO controller 92 for addressing control and data signals between these circuits and the ROM program memory 140, the upload program ROM 150, the program RAM 160 having temporary scratch pad memory and the data storage RAM 170. The address latch circuit 125 may interface with the microcontroller 130 via a 16 byte address bus. Because the microcontroller 130 typically has limited lines, the first 8 bytes of the address bus are also data bus latches while the other 8 bytes are for the address and are tied to the address bus. That is, that total bus size from the microcontroller 130 is 16 bytes which uses the 16 bytes as an address bus while the first 8 bytes comprise a databus latching medium.

The address decoder 120, shown in FIGS. 3, 4, and 5 (i.e. the decoder in FIG. 5) decodes the target address based on user and hardware input thereby identifying and controlling the communications with the microcontroller 130. The decoder 120, determines which peripheral, such as a RAM, ROM, PIO, serial port or display, the microcontroller 130 wants to talk to and decides which peripheral communicates with the microcontroller 130 at a given time. Accordingly, the decoder 120 interfaces with the RAM and ROM locations, 140–170, and the display 110, as well as the microcontroller 130. With reference to FIG. 5, the decoder also has some electrical interconnection with the A/D converter 72 and the PIO controller 92.

An interface serial port 180 is also shown in FIGS. 3 and 4 for communicating with computer peripherals. The interface serial port is preferably an RS-232 serial port interface but may be any other conventional communication link for communicating with the microcontroller without departing from the scope and spirit of the instant invention. The serial port interface allows obtained data measurements and calculations to be downloaded along with a menu driven program into a peripheral computer so that battery cell data may be further analyzed for determining battery cell integrity. A list of menu options may also be downloaded to a computer over the serial port so that the user may easily manipulate data inputs from the battery tester 10 or extract other information from the battery tester 10 and exercise various optional subroutines for extracting and analyzing data procured from the battery tester.

The instant invention is preferably powered from a conventional wall outlet supplying 110 to 120 VAC. In addition, the instant invention supplies a backup rechargeable battery 205 source for providing backup power to the battery tester unit 10 in the event of main VAC power failure. A power supply charger 210 is supplied, as shown in FIGS. 3 and 4, for charging the backup battery 205. The power supply in FIG. 4 is shown by the reference numeral 200 which includes the main and backup power.

With reference to FIG. 3, another block diagram of the instant invention is shown, a simplified block diagram illustrating the electrical links and communication between the display 110, keyboard 101 and keyboard decoder 100, PIO controller 92, address decoder 120, the resistance load circuit 20 including resistance loads 21–26, load module driver circuit 80, input divider circuit 40, pre-AMP circuit 30, multiplexer 60, A/D converter circuit 70, microcontroller 130, and the ROM 140–150 and RAM 160–170. The ROM includes program ROM 140 and upload program ROM 150, while RAM includes programmed RAM and temporary memory RAM 160, data storage RAM 170. In FIG. 3 the detailed breakdown of ROM and RAM are not shown wherein they are merely shown as ROM and RAM memory but nonetheless accomplish the same results as discussed with reference to FIG. 4. Also included is serial port 180, and the power supply 200 which includes conventional 110–120 VAC wall outlet power and a power supply charger 210 for charging a backup battery 205. With reference to FIG. 3 and 4, communication between the ROM and RAM locations, the address decoder 120, which includes the address latch 125 and decoder 126, the PIO controller output 92, the A/D converter 72, and the display 110 are typically conducted over 8 and 16 byte address buses 222 and 220 respectively, as previously discussed. The routing and controlling of measurements from the current sense lines 28, 29 and voltage drop readings between 50, 52 and 54 are dictated by the MUX 60 which receives current sense and voltage drop analog inputs and outputs those to the A/D converter. The MUX 60 thereby selects inputs to the A/D converter 72 for reading. The inputs selected include the intercell voltage drop, the battery cell voltage drop and the current load as internally measured. The A/D converter 72 converts the analog signals to digital for routing to the microcontroller 130 and the ROM and RAM locations 140–170.

As seen in FIGS. 5a–5h, a more detailed schematic diagram of the instant invention hardware is shown. The various circuits and their interface and interaction as noted above is shown in detailed schematic view in FIG. 5. The address latch 125 and decoder 126, comprising the address decoder 120, are shown interfacing over 8 byte and 16 byte buses with the PIO controller 92, the ROM program memory 140, the ROM software update 150, the program RAM or temporary scratch pad memory 160 and the data storage RAM 170 and the microcontroller 130. The exact PIN locations are not identified but the electrical communication is clear. Voltage inputs from the tested cell 5 and the series connected cell are received by the input jack J4 and voltage divided by the input divider circuit 40 which includes relays 42, 44, and 46. The intercell conductor voltage drop across V2 and V3, i.e. 52 and 50, are amplified in the pre-amp circuit 30 which includes amplifier 32, and variable amplification resistor 33, relay 34, a varister 38 and signal conditioning resistive loads 36 for dictating the level of amplification. The load driver circuit 80 controls the 2 volt, 6 volt and 12 volt relays 21a, 24a, and 26a, respectively, via the PIO, transistors 82, 84 and 86 and their corresponding resistive loads. The transistor 88 shown in the load driver circuit 80 is connected to an 8 volt battery supply as shown, while the transistor 89 is electrically coupled to a fan control also shown. The keyboard decoder integrated circuit 100 electrically interfaces with the keyboard and keypad 101 and supplies outputs to the PIO controller 92 and microcontroller 130. The PIO controller 92 is selectably interfaced with the load driver circuit 40 as shown for automatically selecting the appropriate loads for the tests being conducted by the user as dictated through the user interface 101. The PIO controller 92 communicates with the A/D converter 72 ROM and RAM memory locations 140–170, the microcontroller 130 and the decoder 126 as shown. The PIO controller 92 primarily communicates over an 8 byte bus with the address latch 125 and the ROM and RAM locations 140–170, and the microcontroller 130 as shown. The microcontroller 130 establishes a communication link with the serial port 180 as shown, wherein the serial port incorporated is an RS-232 as shown. The RS-232 serial port 180 is coupled to a multi-pin jack J1 as shown. An optional audible buzzer 131, as shown, may be connected to the microcontroller 130 for sounding an audible alarm when positive connections are made with the tested cell 5. The buzzer is referenced by numeral 131. The A/D clock used for controlling the timing of the A/D converter 72, as shown by reference numeral 76, is preferably a counter divided by sixty for clocking down. The A/D clock comprises NOR gates 76a and 76b, a crystal oscillator 76e connected to integrated chip 76f which feeds outputs to NOR gate 76b, and flip flops 76c and 76d which provide outputs to the A/D converter 72 as shown. The A/D reference 74 provides reference voltages to the A/D converter 72 and comprises an integrated chip 74a and a reference adjustment resistive load 74b, as shown. The power supply 200 is also shown in FIG. 5 and includes a fuse 201, preferably rated for 1 to 2 amperes, and voltage controller chips 202 and 203. Grounding capacitors are also shown for filtering out noise and they are referenced by numeral 204 collectively. The foregoing generally outlines the schematic of FIG. 5, but more detailed analysis may be made and referenced to the schematic as shown.

Figure 6:
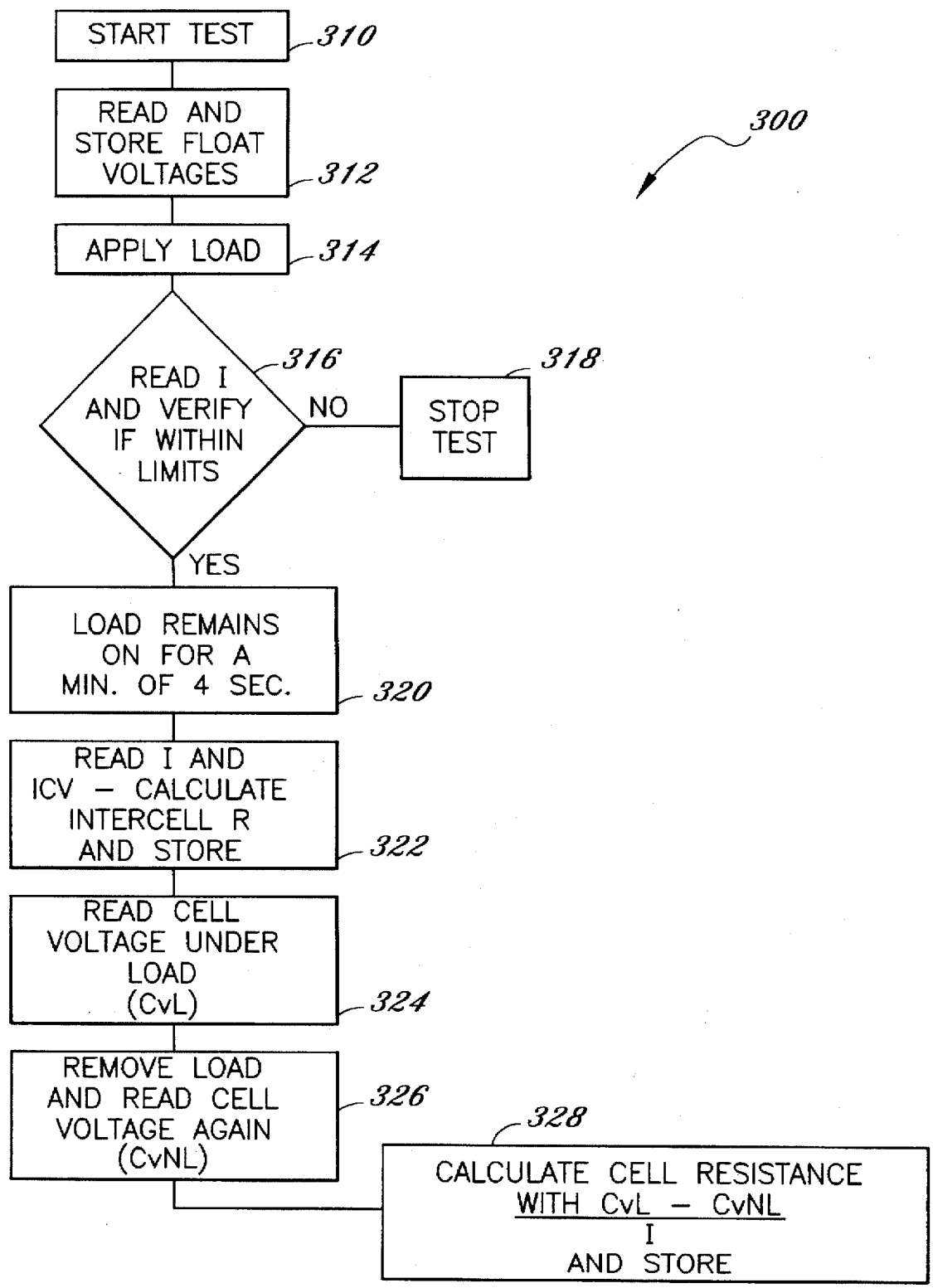
FIG. 6 is a flow chart of the software algorithm of the preferred embodiment of the instant invention illustrating the flow of basic algorithm steps used in conducting tests on battery cells.

A flow chart of the instant invention is shown in FIG. 6, illustrating the main and basic steps conducted. This software algorithm of the instant invention communicates and connects conventional hardware components in a unique manner to provide automatic testing of battery cells in a way undisclosed by background devices. The flow chart of FIG. 6 is referenced by numeral 300 where it begins at the starting point 310. The battery cell to be tested 5 is first connected with the second set three clip probe, as previously discussed. After the connections are made to the battery cell being tested 5 and the series connected cell, as shown in FIGS. 3–5, the software of the instant invention reads and stores float voltages, that is the battery cell voltages before a load is applied. See block 312. Subsequently, as shown in block 314, the instant invention applies a resistive load or loads to the tested cell 5 via the load driver circuit 40. Before proceeding, the instant invention preferably verifies proper and safe connections and conditions by reading the current draw to verify whether it is within proper limits. If this test fails then the testing is terminated as indicated by block 318. If the current readings are within the predetermined limits then the test proceeds as shown by decision block 316. A load preferably remains electrically coupled to the tested cell and intercell connect 7 for a minimum of 4 seconds thereby allowing for natural voltage drop in the battery which occurs instantaneously as discussed and noted above. After this predetermined time lapse as shown by block 320, the instant invention subroutines cause the current draw and intercell voltage to be read or measured for calculating the intercell resistance. Block 322 further shows that after reading the intercell current and voltage drop, calculations are made by the algorithm to determine intercell resistance which is subsequently stored in the data storage RAM location 170. Once again, the intercell resistance is a resistance measurement and calculation of the intercell connect 7 joining the tested cell and series cell in an electrical series and is thereby a calculation of the intercell connect voltage drop divided by its current draw. The current sense lines 28 and 29 allow for the reading of currents. The internal cell resistance is next determined for the cell being tested 5 by reading the internal cell voltage underload and the current draw. Subsequent to taking an internal cell voltage reading under load, the load is automatically removed and the internal cell voltage is once again measured. See blocks 324 and 326. To determine the internal cell resistance the calculation is made whereby the internal cell voltage with no load is subtracted from the internal cell voltage underload and then divided by the current measured. This internal cell resistance calculation is then stored in the data stored RAM location 170. This subroutine as illustrated in FIG. 6 just shows the basic steps and outlines of a typical measurements and calculations for determining voltage drops, current readings and intercell and internal cell resistance. The steps are used for arriving at the measurements and calculations for voltage, current and resistance, and may vary without departing from the scope or spirit of the instant invention. That is, the instant invention provides an automated way of applying and removing loads and performing integrity tests on battery cells for determining a battery cell's capacity. The tests performed are controlled by software which performs DC load testing in an automated way and stores the results in RAM and temporary RAM memory locations for performing calculations and extracting the data obtained. The data extractions may be imported to a network or computer peripheral over the serial ports, as shown and discussed with reference to the figures. The instant invention also supplies a first set of probes for conducting conventional voltmeter and multimeter readings apart from the automated test as just discussed.

The instant invention has been shown and described herein in what is considered to be the most practical and preferred embodiment. It is recognized, however, that departures may be made therefrom within the scope of the invention and that obvious modifications will occur to a person skilled in the art.

What is claimed is:

1. A data storing battery tester and multimeter for testing at least one battery in a plurality of batteries to predict whether said battery can provide a predetermined power level by determining at least the battery internal cell resistance, said battery being electrically connected in series by at least one conductive intercell link, said battery and batteries being connected to and used to supply power in electrical systems, said tester comprising:

an adjustable direct current (DC) resistance load;

resistance loading means, in electrical communication with said adjustable load, for selectively and automatically applying and removing said adjustable load across said battery while said battery remains connected to the electrical system to facilitate a load voltage and a float voltage, respectively, and to draw current;

processor means, in electrical communication with said resistance loading means, for reading said load voltage, said float voltage and said current draw and for calculating resistance of the intercell link and said internal cell resistance using said voltages and said current draw; wherein said load voltage, float voltage, current draw, intercell link resistance and internal cell resistance comprise data, said processor means including a prediction means for determining whether the battery can provide the predetermined power level based on said data;

memory means, in electrical communication with said processor means, for storing an algorithm used by said processor means to read and calculate said data and for storing said data computer interface means, in electrical communication with said processor means, for communicating and interfacing with at least one computer peripheral to facilitate transferring said data to said computer; and signal control means, in electrical communication with said resistance loading means and said processor means, for receiving input command signals and electrically providing output control signals to said processor means to facilitate the applying and removing of said adjustable load from said battery and processing of said data.

2. A battery tester as recited in claim 1, wherein said processor means comprises a microprocessor.

3. A battery tester as recited in claim 2, wherein said tester further comprises:

signal transfer means, in electrical communication with said processor means, memory means and resistance loading means, for electrically interfacing said processor means, memory means and resistance loading means for allowing said data to be transferred in multiple bytes.

4. A battery tester as recited in claim 3, wherein said resistance loading means further comprises means for amplifying signals generated by said battery to facilitate processing of said load and float voltages.

5. A battery tester as recited in claim 4, further comprising user interface means, in communication with said processor, for allowing a user to select and control said resistance loading means to control the applying and removing of said adjustable load.

6. A battery tester as recited in claim 2, wherein said resistance loading means comprises:

a load module driver in electrical communication with said adjustable load; and a plurality of electrically controlled switches electrically controlled by said load module driver for applying and removing said adjustable load.

7. A battery tester as recited in claim 1, wherein said tester further comprises:

multiplexor means, in electrical communication with said processor means and said resistance loading means, for receiving analog signals indicating said load and float voltage and said current draw and for directing said signals to said processor means in a predetermined order to predetermined locations in said processor means.

8. A battery tester for predicting whether a battery in a plurality of batteries will be able to provide required power to a known load based on at least internal cell resistance in said battery and intercell resistance of a conductive link electrically joining said battery to said plurality of batteries, said battery and batteries being connected to used to supply power to an electrical system, said tester comprising:

an adjustable direct current (DC) resistance load;

resistance loading means, in electrical communication with said adjustable load, for selectively and automatically applying and removing said adjustable load across said battery while said battery remains connected to the electrical system to facilitate a load voltage and a float voltage, respectively and to a current draw;

a programmable processor means, in electrical communication with said resistance loading means, for reading said load and float voltages and said current draw and for calculating said internal cell resistance and intercell resistance using said voltages and said current draw, wherein said load voltage, float voltage, current draw, intercell resistance and internal cell resistance comprise data, said processor means including a prediction means for determining whether the battery can provide the predetermined power level based on said data;

memory means, in electrical communication with said processor means, for storing an algorithm used by said processor means to read and calculate said data and for storing said data;

parallel input-output (I/O) controller, in electrical communication with said resistance loading means and said processor means, for receiving input command signals and electrically providing output control signals to said processor means to facilitate the applying and removing of said adjustable load from said battery and processing of said data; and user interface means, in electrical communication with said parallel I/O controller and said processor, for initiating said processor means and said resistance loading means to control the applying and removing of said adjustable load and to determine whether said battery can provide said required power.

9. A battery tester as recited in claim 8, wherein said tester further comprises:

an analog-to-digital converter, in electrical communication with said signal control means and said processor means; and multiplexor means, in electrical communication with said processor means, said analog-to-digital converter and said resistance loading means, for receiving analog signals indicating said load and float voltage and said current draw, for sending selected signals from said analog signals to said analog-to-digital converter to convert to digital signals, and for directing said analog signals to said processor means in a predetermined order to predetermined locations in said processor means.

10. A battery tester as recited in claim 9, wherein said tester further comprises:

computer interface means, in electrical communication with said processor means, for communicating and interfacing with at least one computer peripheral to facilitate transfering said data to said computer.

11. A battery tester as recited in claim 10, wherein said tester further comprises:

amplifier means, in electrical communication with said resistance loading means, for amplifying signals comprising said load and float voltages to facilitate processing; and voltage divider means, in electrical communication with said multiplexor means, for reducing voltage levels in signals comprising said load and float voltages.

12. A battery tester for predicting whether a battery in a plurality of batteries will be able to provide required power to a known load based on at least internal cell resistance in said battery and intercell resistance of a conductive link electrically joining said battery to said plurality of batteries, said battery and batteries being connected to used to supply power to an electrical system, said tester comprising:

an adjustable direct current (DC) resistance load;

resistance loading means, in electrical communication with said adjustable load, for selectively and automatically applying and removing said adjustable load across said battery while said battery remains connected to the electrical system to facilitate a load voltage and a float voltage, respectively and to a current draw;

a programmable processor means, in electrical communication with said resistance loading means, for reading said load and float voltages and said current draw and for calculating said internal cell resistance and intercell resistance using said voltages and said current draw, wherein said load voltage, float voltage, current draw, intercell resistance and internal cell resistance comprise data, said processor means including a prediction means for determining whether the battery can provide the predetermined power level based on said data;

memory means, in electrical communication with said processor means, for storing an algorithm used by said processor means to read and calculate said data and for storing said data;

parallel input-output (I/O) controller, in electrical communication with said resistance loading means and said processor means, for receiving input command signals and electrically providing output control signals to said processor means to facilitate the applying and removing of said adjustable load from said battery and processing of said data;

computer interface means, in electrical communication with said processor means, for communicating and interfacing with at least one computer peripheral to facilitate transferring said data to said computer; and user interface means, in electrical communication with said parallel I/O controller and said processor, for initiating said processor means and said resistance loading means to control the applying and removing of said adjustable load and to determine whether said battery can provide said required power.

13. A battery tester as recited in claim 12, wherein said tester further comprises:

an analog-to-digital converter, in electrical communication with said signal control means and said processor means; and multiplexor means, in electrical communication with said processor means, said analog-to-digital converter and said resistance loading means, for receiving analog signals indicating said load and float voltage and said current draw, for sending selected signals from said analog signals to said analog-to-digital converter to convert to digital signals, and for directing said analog signals to said processor means in a predetermined order to predetermined locations in said processor means.

14. A battery tester as recited in claim 13, wherein said resistance loading means comprises:

a load module driver in electrical communication with said adjustable load; and a plurality of electrically controlled switches in electrically controlled by said load module driver.

15. A battery tester as recited in claim 14, wherein said tester further comprises:

amplifier means, in electrical communication with said resistance loading means, for amplifying signals comprising said load and float voltages to facilitate processing; and voltage divider means, in electrical communication with said multiplexor means, for reducing voltage levels in signals comprising said load and float voltages.

* * * * *